United States Patent
Doi

(10) Patent No.: US 6,333,868 B1
(45) Date of Patent: Dec. 25, 2001

(54) SEMICONDUCTOR MEMORY DEVICE HAVING SELECTIVELY SHIELDED DATA LINES

(75) Inventor: Hitoshi Doi, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 0 days.

(21) Appl. No.: 09/691,048

(22) Filed: Oct. 19, 2000

(51) Int. Cl.$^7$ .................................................. G11C 7/02
(52) U.S. Cl. .............................. 365/63; 365/53; 365/51
(58) Field of Search ............................... 365/51, 63, 53, 365/230.03, 190

(56) References Cited

U.S. PATENT DOCUMENTS 5,657,286 * 8/1997 Arimoto ............................... 365/205
6,108,264 * 8/2000 Takahashi et al. ............... 365/230.03
6,212,091 * 4/2001 Kawabata et al. ..................... 365/63

* cited by examiner

*Primary Examiner*—Son Mai
(74) *Attorney, Agent, or Firm*—Volentine Francos, PLLC

(57) ABSTRACT

A semiconductor memory device having a data bus connecting a differential amplifier circuit of a memory cell array, which uses the differential amplifier circuit as input/output terminals of data to the selected memory cells out of a plurality of memory cells, with a plurality of input/output pads for writing and reading data to and from the memory cells. The data bus has a plurality of write data lines and a plurality of read data lines. The write and read data lines of the data bus are arranged in parallel with one another. The two kinds of data lines are arranged alternately in the direction in which they are arranged, and one kind of the data lines serves as the shielding lines for the other other kind of data lines.

14 Claims, 5 Drawing Sheets

SEMICONDUCTOR MEMORY DEVICE HAVING SELECTIVELY SHIELDED DATA LINES

BACKGROUND OF THE INVENTION

1. Field of the Invention

The present invention relates to a semiconductor memory device and more particularly to a semiconductor memory device, such as a dynamic random access memory and a static random access memory.

2. Description of Related Art

In a semiconductor memory device comprising a memory cell array having a number of memory cells arranged in a matrix formation, data is written in or read out of a memory cell selected through a pair of complementary bit lines extending from the memory cells in the memory cell array.

When reading data from a memory cell, data of a selected memory cell is detected by a sense amplifier, formed by a differential amplifier, through a pair of bit lines (often referred to as a bit line pair). When writing data into a memory cell, in the same way as in reading data mentioned above, data is written into a memory cell corresponding to the selected bit line pair as voltage signals applied through the sense amplifier and the bit line pair.

Because bit line pairs, each pair having mutually complementary bit lines, are arranged mutually close to each other, if data on the bit lines is interfered with the parasitic capacity between the bit lines placed close together, data reading or writing becomes unstable, which results in delay or malfunction.

To prevent the instability in data reading or writing ascribable to the parasitic capacity between bit lines, there are disclosed techniques in Japanese Patent Laid-Open Publication No. Hei 6-5081: a technique for increasing distance between bit line pairs in a memory cell array; a technique for arranging between the bit line pairs additional shielding lines different from the bit lines and not transfering data for reading/writing; and a technique for having the two component lines of a bit line pair intersect each other.

Further, Japanese Patent Laid-Open Publication No. Hei 10-69773 discloses a new idea for arranging bit line pairs in such a way that the bit line pairs, which are selected simultaneously, do not lie side by side with each other.

Further, Japanese Patent Laid-Open Publication No. 2000-82290 discloses a technique by which to arrange a shielding line between the bit lines.

These techniques can prevent the instability of data in the memory cell array.

However, these techniques are unable to stabilize data in the data bus extending externally from the memory cell array.

SUMMARY OF THE INVENTION

The object of the present invention is to provide a semiconductor memory device capable of stabilizing data in the data bus extending from the memory cell array.

According to one aspect of the present invention, there is provided a semiconductor memory device comprising a memory cell array having a plurality of memory cells on a semiconductor substrate, wherein the memory cell array includes a differential amplifier circuit serving as data input/output terminals of the memory cell array when data is written in or read from the memory cell selected; a plurality of input/output pads, provided on the semiconductor substrate, for write data to the memory cells or read data from the memory cells; and a data bus for connecting the differential amplifier and the input/output pads, wherein the data bus includes a plurality of write-only data lines dedicated to writing data to the memory cells and a plurality of read-only data lines dedicated to reading data from the memory cells, wherein the plurality of write-only data lines have mutually parallel portions and the plurality of read-only data lines have mutually parallel portions, wherein at least the parallel portions of the write-only data lines are arranged alternately with the read-only data lines in the arrangement direction of the parallel portions on the semiconductor substrate, and wherein either the write-only data lines or the read-only data lines function as shielded lines.

According to another aspect of the present invention, there is provided a semiconductor memory device comprising: a memory cell array which has a plurality of memory cells and a differential amplifier circuit, the differential amplifier circuit amplifying a data read from the memory cell and a write data to be written into the memory cell; a plurality of input/output pads which receives the write data or the read data; and a data bus, coupled between the amplifier circuit and said input/output pads, which includes a plurality of write-only data lines transferring the write data and a plurality of read-only data lines transferring the read data, wherein the write-only data lines and the read-only data lines have mutually parallel portions, wherein at least the parallel portions of said write-only data lines are arranged alternately with said read-only data lines in the arrangement direction of said parallel portions, wherein said write-only data lines are held at a predetermined potential level when said read-only data lines transfer the read data, and wherein said read-only data lines are held at a predetermined potential level when said write-only data lines transfer the write data.

DESCRIPTION OF PREFERRED EMBODIMENT

A preferred embodiment of the present invention will be described in detail with reference to the accompanying drawings.

Figure 1:
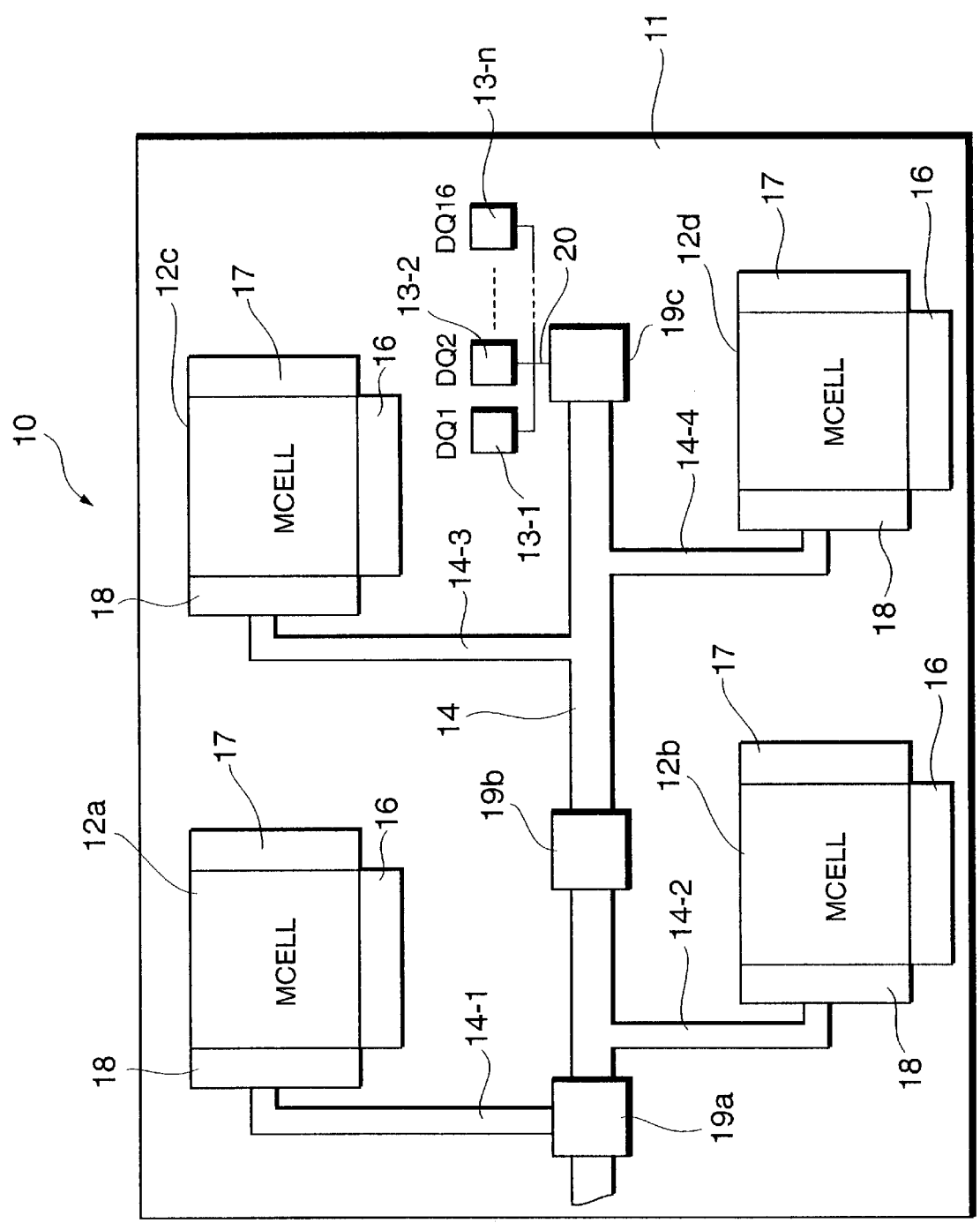
FIG. 1 is a plan view schematically showing the semiconductor memory device according to the present invention.

As shown in FIG. 1, a semiconductor memory device 10 according to the present invention includes a semiconductor substrate 11, a plurality of memory cell arrays 12 formed on the semiconductor substrate 11, a plurality of input/output pads 13 formed on the semiconductor substrate 11, and a data bus 14 for electrically connecting the memory cell arrays with the input/output pads 13.

The semiconductor memory device 10 has n input/output pads 13 (13-1, 13-2 . . . 13-n) to enable n bits process to be performed concurrently.

As is well known, the semiconductor memory device 10 is controlled by control signals from CPU, not shown, which include a control signal to direct it to perform a read operation and a control signal to direct it to perform a write operation.

As illustrated in FIG. 1, the memory cell arrays 12 are formed on the semiconductor substrate 11 as four banks 12a, 12b, 12c and 12d, which are spaced apart from one another. In each of the memory cell arrays 12a, 12b, 12c and 12d, there are provided well-known X decoder 16 and Y decoder 17 for generating selection signals to select n pieces of memory cells 15, required for concurrent processing of n bits, from a plurality of memory cells 15 (see FIG. 3) arranged in a matrix formation. In addition, each memory cell 12 incorporates a well-known differential amplifier circuit 18 as input/output terminals for the memory cell.

The data bus 14 has a plurality of amplifier circuits 19 (19a, 19b and 19c) for amplifying data signals that is transferred on the data bus. The data bus 14 includes branch portions 14-1, 14-2,14-3 and 14-4, which extend to the memory cell arrays 12 and are connected to the differential amplifier circuits 18 of the corresponding memory cell arrays 12 (12a, 12b, 12c and 12d). As illustrated in FIG. 1, the data bus 14 is connected to the input/output pads 13 (13-1, 13-2, 13-3 . . . 13-n) through branch circuits 20 extending from the amplifier circuit 19c at the end of the data bus to the input/output pads 13.

When data is read from the memory cells, data is read from n selected pieces of the memory cells 15 through the differential amplifiers 18 of the respective memory cell arrays 12, and then the data bus 14 transfers the data to the corresponding input/output pads 13 simultaneously. On the other hand, when data is written into the memory cells, the data bus 14 transfers n pieces of data simultaneously to the differential amplifier circuits 18 of the memory cell arrays 12 to write the data into n selected pieces of the memory cells 15.

The amplifier circuits 19 (19a, 19b and 19c) on the data bus 14 amplify potential levels of data on the data bus to prevent the attenuation of the potential levels.

Figure 2:
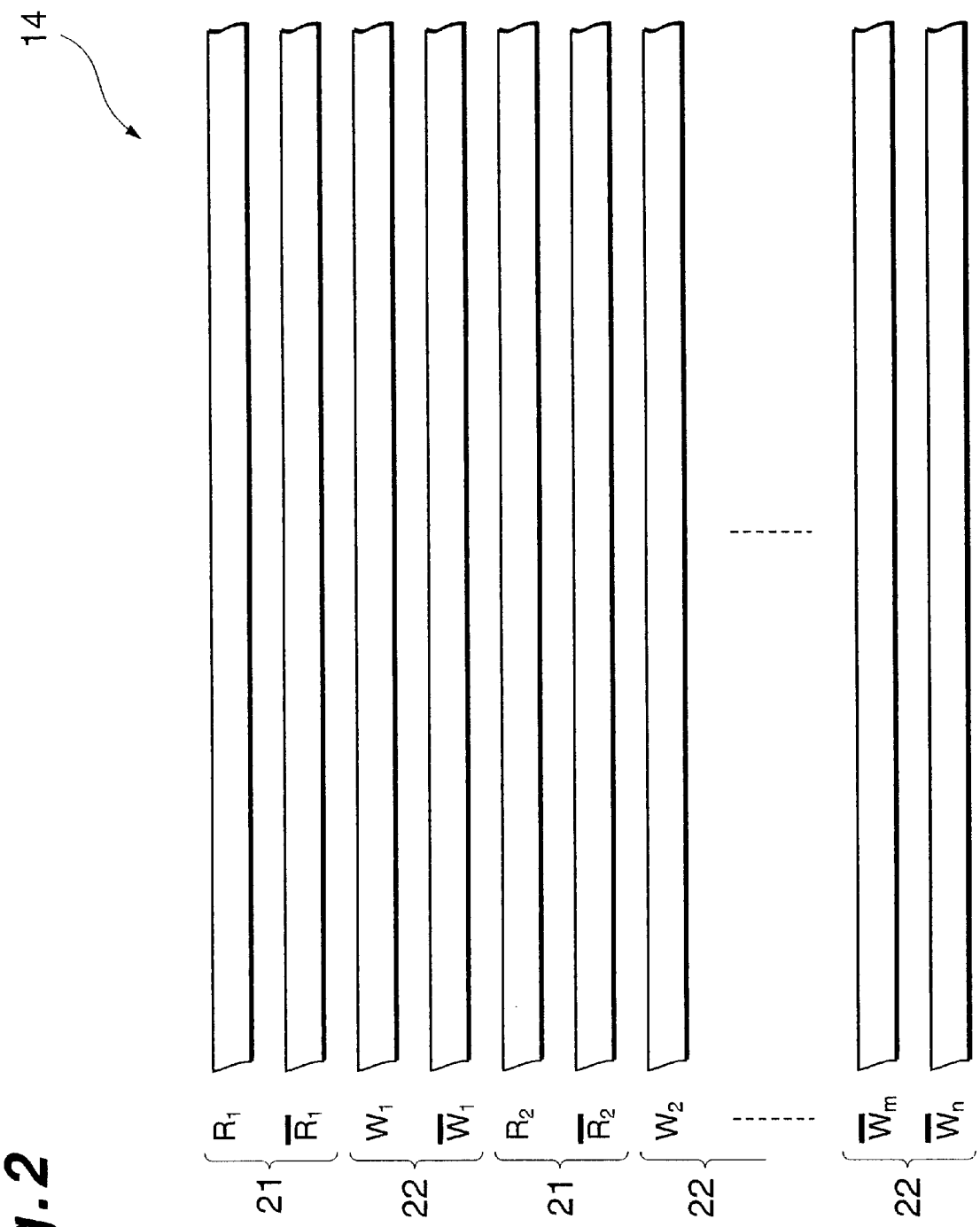
FIG. 2 is a plan view showing on an enlarged scale a part of the data bus of the semiconductor memory device shown in FIG. 1.

The data bus 14 according to the present invention includes branch portions 14-1, 14-2, 14-3 and 14-4. As shown in FIG. 2, the data bus 14 consists of a plurality of sets of, in other words, n sets of read-only data lines 21 and n sets of write-only data lines 22 (n≧2).

The n sets of read-only data lines 21 constitute a read-only data bus, and the n sets of write-only data lines 22 constitute a write-only data bus. FIG. 2 shows that portion of the data bus 14 which extends in a straight line.

Each read-only data line 21 has one read data line (R1, R2 . . . Rn) and another data line ($\overline{R1}, \overline{R2} \ldots \overline{Rn}$); the latter data line is complementary to the former data line. In other words, one read-only data line pair consists of a pair of read-only data lines (R1, $\overline{R1}$), (R2, $\overline{R2}$) . . . (Rn, $\overline{Rn}$).

Each write-only data line 22 has one write data line (W1, W2 . . . Wn) and another data line ($\overline{W1}, \overline{W2} \ldots \overline{Wn}$), the latter data line is complementary to the former data line. In other words, one write-only data line pair consists of a pair of write-only data lines (W1, $\overline{W1}$), (R2, $\overline{R2}$) . . . (Wn, $\overline{Wn}$).

In the straight portions of the data bus 14 and the branches 14-1, 14-2, 14-3 and 14-4, the read-only data lines 21 and the write-only data lines 22 are alternately arranged mutually spaced apart in their width direction. In FIG. 2, the read-only data line pairs and the write-only data line pairs extend in parallel and alternate with each other, mutually spaced apart, in the order of a read-only data line pair (R1, $\overline{R1}$), a write-only data line pair (W1, $\overline{W1}$), a read-only data line pair (R2, $\overline{R2}$), and so on from the top downward in the plane of the drawing.

Figure 3:
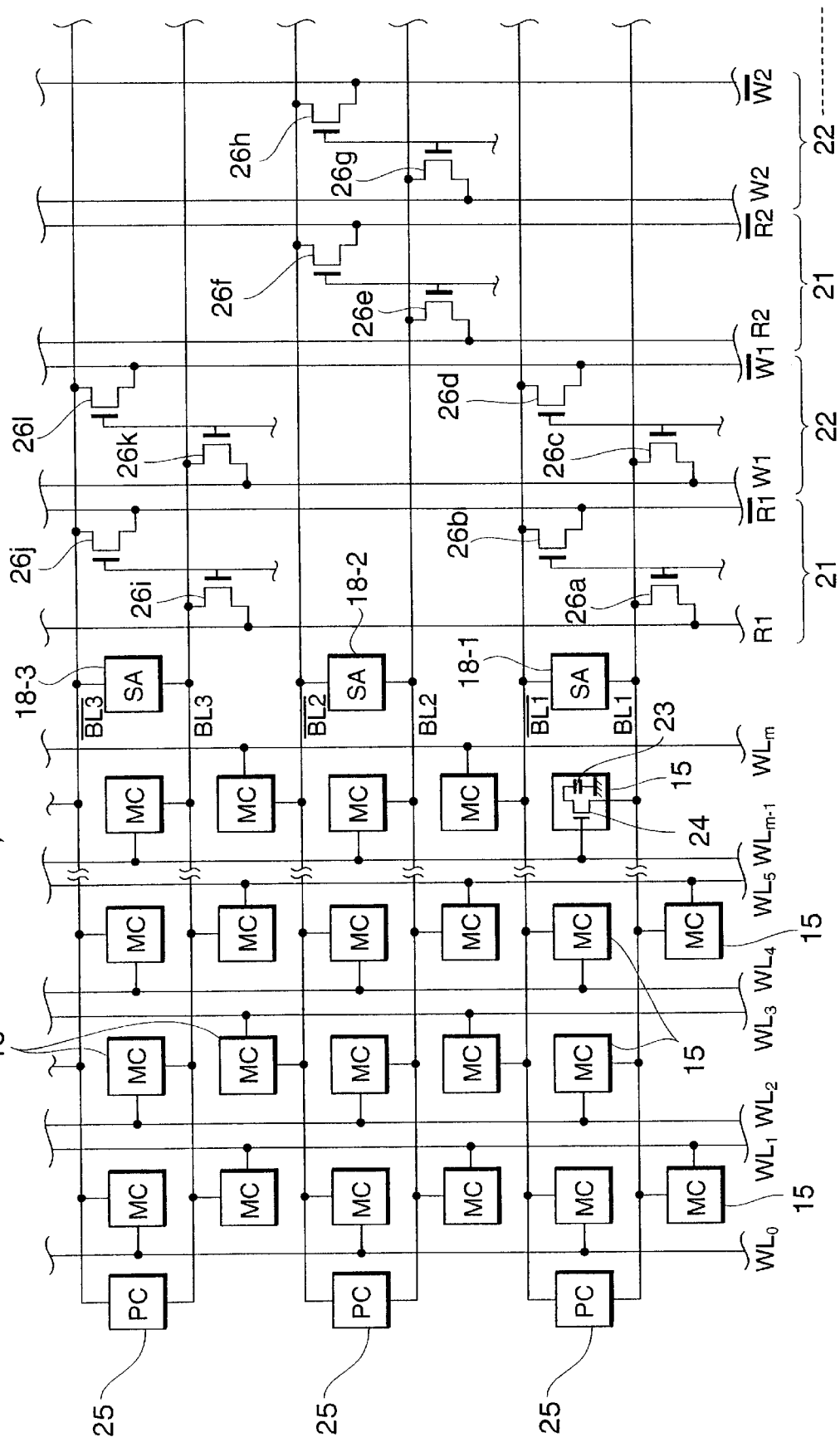
FIG. 3 is a circuit diagram showing the connection relation between the data bus shown in FIG. 1 and the memory cells.

FIG. 3 shows the connection relation between the data bus 14, to be more specific, branch portions (14-1, 14-2, 14-3 and 14-4) and the memory cell arrays 12 (12a, 12b, 12c, 12d).

As is well known, the memory cell array 12 has many memory cells 15 arranged in a matrix form and the memory cells are placed in rectangular areas on the semiconductor substrate 11, defined by a number of mutually parallel bit line pairs (BL1, $\overline{BL1}$), (BL2, $\overline{BL2}$), (BL3, $\overline{BL3}$) . . . and a number of mutually parallel word lines WL0, WL1, WL2 . . . WLm, which intersect the bit line pairs.

In the example in FIG. 3, the semiconductor memory device 10 is a dynamic random access memory, in which one memory cell 15 has a memory capacitor 23 and a cell switch 24.

Between each pair of bit lines (BL1, $\overline{BL1}$), (BL2, $\overline{BL2}$), (BL3, $\overline{BL3}$) . . . (BLn, $\overline{BLn}$), each pair constituting a bit line pair, there is provided a pre-charging circuit 25 for pre-charging to a specified potential the pair of bit lines (bit line pair) selected by the control signals from the CPU, not shown. The above-mentioned pre-charging to a specified potential is done before data is read from a memory cell 15.

Also provided between each pair of bit lines (BL1, $\overline{BL1}$), (BL2, $\overline{BL2}$), (BL3, $\overline{BL3}$) . . . (BLn, $\overline{BLn}$) is one of the differential amplifiers 18-1, 18-2, . . . 18-n, which serve as input/output terminals of the memory cell arrays 12.

The branch portions 14-1, 14-2, 14-3 and 14-4 of the data bus 14 are connected to the differential amplifiers 18-1, 18-2 . . . 18-n of the corresponding memory cell arrays 12.

As shown in FIG. 3, in the branch portions 14-1, 14-2, 14-3 and 14-4, the data line pairs (R1, $\overline{R1}$), (W1, $\overline{W1}$), . . . (Wn, $\overline{Wn}$) of the read-only data lines 21 and the write-only data lines 22 are arranged at right angles with the bit line pairs (BL1, $\overline{BL1}$), (BL2, $\overline{BL2}$) . . . and the data line pairs are electrically isolated from the corresponding differential amplifiers 18 (18-1, 18-2 . . . 18-n) by the switching transistors 26 (26a, 26b . . . ) and the corresponding bit pairs (BL, $\overline{BL}$).

For example, the read data line R1 of the read-only data line 21 is electrically isolated from the bit lines BL1 and BL3 by the transistors 26a and 26i. On the other hand, the read data line $\overline{R1}$, which forms a pair with the read data line R1, is electrically isolated from the bit lines $\overline{BL1}$ and $\overline{BL3}$ by the transistors 26b and 26j.

The read data lines R2, R3 . . . Rn and $\overline{R2}, \overline{R3} \ldots \overline{Rn}$ and the write data lines W2, W3 . . . Wn and $\overline{W2}, \overline{W3} \ldots \overline{Wn}$ are likewise isolated from the corresponding bit lines and the other bit lines, which form pairs with and complementary to the former bit lines by the transistors 26e, 26f, 26g, 26h similar to those mentioned before.

As has been well known, in each memory cell array 12, when writing data in or reading data from a memory cell 15, a word line WLn corresponding to a memory cell 15, which is to be selected, is selected by a selection signal output from the X decoder 16 controlled by a control signal from the central control unit CPU. Then, the bit line pair (BL, $\overline{BL}$) corresponding to the memory cell 15 is selected by a selection signal, similar to the one mentioned above, which is output from the Y decoder 17.

In a writing operation, in response to the selection signal from the Y decoder, the transistors 26 corresponding to the bit line pair of the selected cell 15 electrically connect the corresponding write data line 22 (Wn, $\overline{Wn}$) to the bit line pair. In a reading operation, in response to a selection signal from the Y decoder 17, the transistors 26 corresponding to the bit line pair of the selected memory cell 15 electrically connect the corresponding write data lines 22 (Wn, $\overline{Wn}$) to the bit line pair.

In the writing operation, when the bit line pair BL1, $\overline{BL1}$ are selected, for example, because the switching transistors 26c and 26d turn on, the write data line pair W1, $\overline{W1}$ corresponding to the bit line pair BL1, $\overline{BL1}$ are connected to the corresponding bit line pair BL1 and $\overline{BL1}$.

In the reading operation, when the bit line pair BL2, $\overline{BL2}$ are selected, for example, because the switching transistors 26e and 26f turn on, the read data line pair R2 and $\overline{R2}$ corresponding to the bit line pair BL2 and $\overline{BL2}$ are connected to the corresponding bit line pair BL2 and $\overline{BL2}$.

Figure 4:
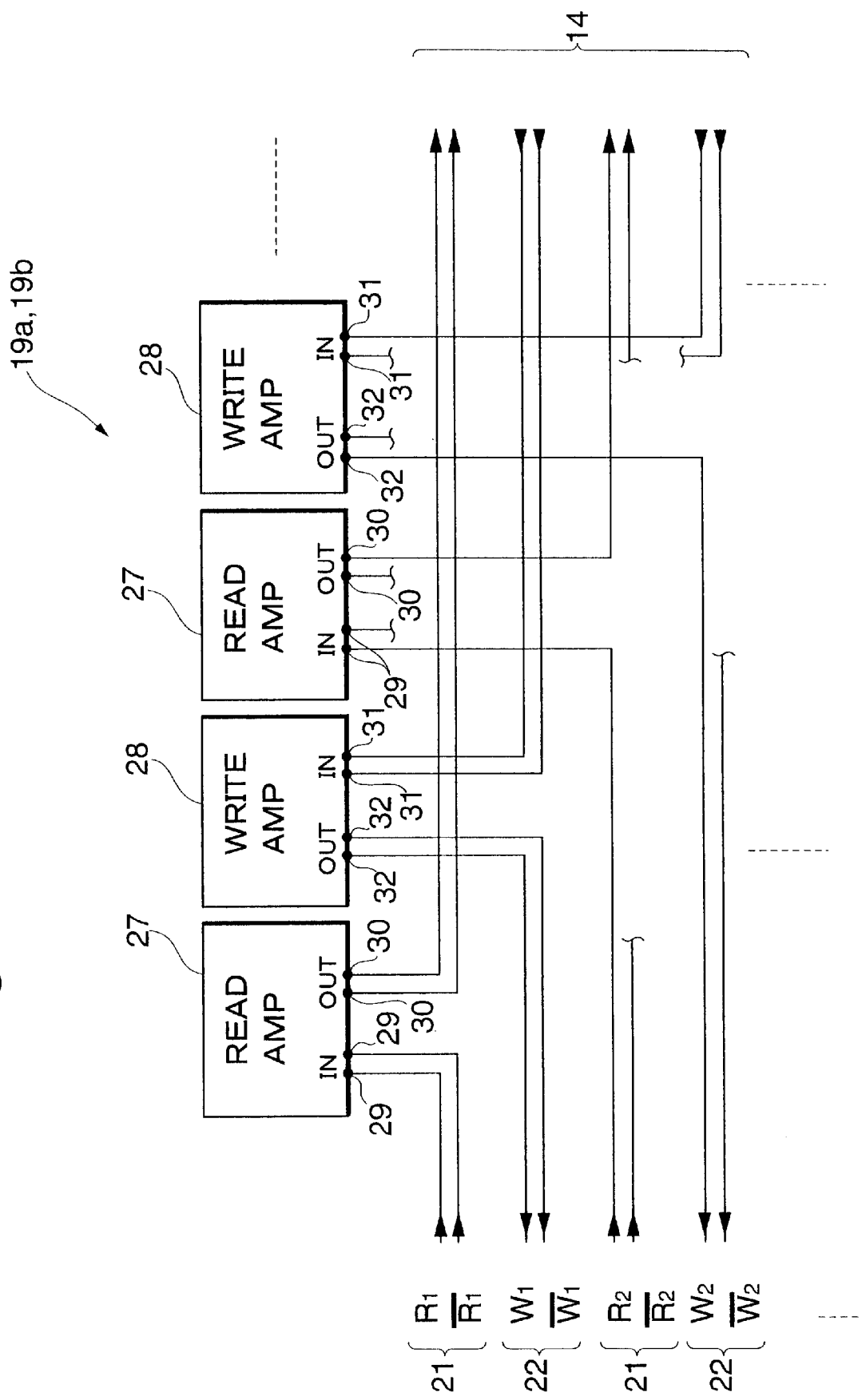
FIG. 4 is a circuit diagram schematically showing the amplifiers and the data bus shown in FIG. 1.

FIG. 4 shows the connection relation the data bus 14 with two amplifier circuits 19a and 19b provided on the data bus.

As shown in FIG. 4, each of the amplifier circuits 19a and 19b consists of a plurality of amplifiers 27 and 28 provided to correspond with the read-only data lines 21 and the write-only data lines 22.

In each amplifier 27 for read-only data line 21, there are provided input terminals 29, 29 and output terminals 30, 30 for each data line pair (R1, $\overline{R1}$, R2, $\overline{R2}$ ... Rn, $\overline{Rn}$), which forms a read-only data line. In the example shown in FIG. 4, a pair of the input terminals and a pair of the output terminals are provided on one side of the amplifier 27.

In each amplifier 28 for write-only data line 22, there are similarly provided input terminals 31, 31 and output terminals 32, 32 for each data line pair (W1, $\overline{W1}$, W2, $\overline{W2}$ ... Wn, $\overline{Wn}$), which forms a write-only data line. In the same way as in the amplifier 27, a pair of the input terminals and a pair of the output terminals are provided on one side of the amplifier 28.

On one side of the data bus 14 comprising a read-only data line 21 and a write-only data line 22, the amplifiers 27 and 28 are arranged with their input terminals and output terminals facing the data bus 14. The amplifiers 27 and 28 are alternately arranged to each other in the longitudinal direction of the date bus 14 with their terminals 29, 30, 31, 32 and so on connected to the corresponding data line pairs (R1, $\overline{R1}$ ... Rn, $\overline{Rn}$, W1, $\overline{W1}$ ... Wn, $\overline{Wn}$).

Figure 5:
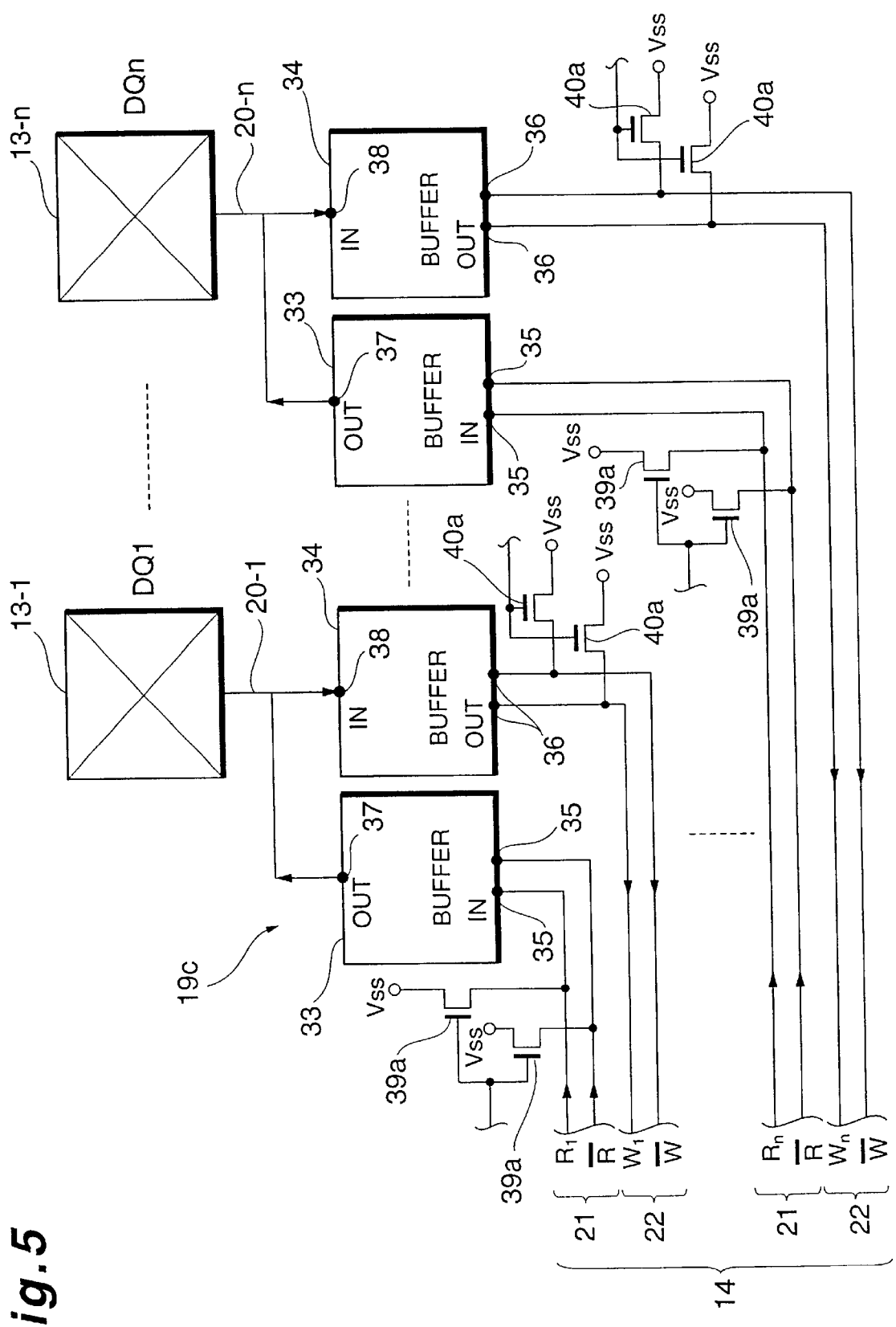
FIG. 5 is a circuit diagram schematically showing the connection relation between the input/output pads and the data bus shown in FIG. 1.

FIG. 5 shows the connection relation between the amplifier circuit 19c at the end of the data bus 14 and the data bus 14.

The amplifier circuit 19c comprises a plurality of buffers 33, 34 and so on provided to correspond to the read-only data lines 21 and the write-only data lines 22. Each read-data-line buffer 33 has a pair of input terminals 35, 35 connected to a data line pair (R1, $\overline{R1}$ ... Rn, $\overline{Rn}$) of the corresponding read-only data line 21. On the other hand, each write-data-line buffer 34 has a pair of output terminals 36, 36 connected to a data line pair (W1, $\overline{W1}$ ... Wn, $\overline{Wn}$) of the corresponding write-only data line 22.

As with the amplifiers 27 and 28, the read-data-line buffers 33 and the write-data-line buffers 34 are arranged in a straight line but alternating with each other. The output terminal 37 of each buffer 33 and the input terminal 38 of each buffer 34 are connected through the corresponding branch line 20-1, 20-2 ... 20-n to the corresponding input/output pad 13 (13-1 ... 13-n). The branch lines 20-1, 20-2 ... 20-n constitute the branch circuit 20 mentioned above.

A switching circuit 39 (39a) is connected to each read-only data line pair (R1, $\overline{R1}$ ... Rn, $\overline{Rn}$). A switching circuit 40 (40a) is connected to each write-only data line pair (W1, $\overline{W1}$ ... Wn, $\overline{Wn}$).

One switching circuit 39 includes a plurality of switching elements 39a for electrically connecting and disconnecting the read-only data line pair (R1, $\overline{R1}$ ... Rn, $\overline{Rn}$) to and from the ground potential Vss as constant voltage sources. Every switching element 39a is a MOS transistor in this example in FIG. 5.

The switching element 39a provided for the read-only data line 21 enters to OFF state so that the read-only data line pair (R1, $\overline{R1}$ ... Rn, $\overline{Rn}$) is electrically isolated from the constant voltage source Vss in response to a read operation signal from the CPU when data is read from the memory cell array 12. Each switching element 39a enters to ON state to connect the read-only data line pair (R1, $\overline{R1}$ ... Rn, $\overline{Rn}$) to the constant voltage source Vss only in a write operation in response to a write operation signal from the CPU.

On the other hand, the switching circuit 40 includes a plurality of switching elements 40a for electrically connecting and disconnecting the write-only data line pair (W1, $\overline{W1}$ ... Wn, $\overline{Wn}$) to and from the constant voltage source Vss. Every switching element 40a is a MOS transistor as with the switching element 39a.

The switching element 40a provided for the write-only data line 22 enters to OFF state so that the write-only data line pair (W1, $\overline{W1}$ ... Wn, $\overline{Wn}$) is isolated from the constant voltage source Vss in response to a write operation signal from the CPU when data is written in the memory cell array 12. Each switching element 40a enters to ON state to connect the write-only data line pair (W1, $\overline{W1}$ ... Wn, $\overline{Wn}$) to the constant voltage source Vss only in a read operation in response to a read operation signal from the CPU.

The switching elements 39a and 40a are preferably provided at the end portion of the data bus 14 which is close to the input/output terminals 13. Alternatively, the switching elements may be provided in the middle of the data bus 14 except for its branch portions 14-1, 14-2, 14-3 and 14-4.

In the semiconductor memory device according to the present invention, when data is read from the memory cell array 12 in response to a control signal from the CPU, a specified pre-charge potential is applied to the corresponding bit line pair BL and $\overline{BL}$ by the pre-charging circuit 25. As the word line WL corresponding to the selected memory cell 15 is selected, as has been well known, the memory cell switch in the selected memory cell 15 at an intersection between the selected bit line pair BL and $\overline{BL}$ and the selected word line WL turns on. By this operation of the cell switch 24, a potential difference occurs between the two bit lines of the bit line pair, which corresponds to the electric charge or a signal voltage in the cell capacitor 23 of the memory cell. This potential difference is amplified by the sense amplifier formed by a differential amplifier 18 (18-1 ... 18-n) provided between the bit lines.

For example, when the bit line pair BL1 and $\overline{BL1}$ are selected in a read operation, for example, the switching transistors 26a and 26b turn on, which correspond to the read-only data line pair related to the bit line pair BL1 and $\overline{BL1}$. Except for the switching transistors 26 related to read-only data line pair used for concurrent bit processing, the other switching transistors 26 are placed in OFF states, including the transistors 26 related to the other read-only data bit pairs and the transistors 26 related to all write-only data line pairs, such as those transistors 26 related to the write-only data line pairs corresponding to the selected bit line pairs BL1 and $\overline{BL1}$.

By turning on of the switching transistors (26) corresponding to the n selected bit line pairs for concurrent bit processing, including the bit line pair BL1 and $\overline{BL1}$, a potential difference is read out through the sense amplifier 18 as data from each selected memory cell 15 on each selected read-only data line pair via the bit line pair corresponding to the data line pair.

As described with reference to FIG. 5, in the read operation, the switching elements 39a of the switching circuit 39 provided for the read-only data lines electrically isolate the read-only data line pairs (R1, $\overline{R1}$ ... Rn, $\overline{Rn}$) from the respective constant voltage sources Vss.

In the read operation, the switching elements 40a of the switching circuits 40 provided for the write-only data line pairs electrically connect the write-only data line pairs (W1, $\overline{W1}$ ... Wn, $\overline{Wn}$) to the respective constant voltage sources Vss.

Therefore, data of the n selected memory cells 15 is output to the corresponding input/output pads 13 (13-1 ... 13-n) through the data line pairs (R1, $\overline{R1}$ ... Rn, $\overline{Rn}$) as the read data lines.

In the read operation, as mentioned above, because the write-only data line pairs arranged between the read-only data line pairs are kept at a constant ground potential Vss, the write-only data line pairs serve as the shielding lines for the read-only data line pairs located between them.

Therefore, during transfer of data through the read-only data line pairs, owing to the shielding provided by the write-only data line pairs lying between adjacent read-only data line pairs, it is possible to prevent data from becoming unstable while it passes through the read-only data line pairs, which is caused by the conventional coupling capacity between the data line pairs.

In the write operation in the semiconductor memory device 10, as has been described with reference to FIG. 5, the switching elements 40a of the switching circuits 40 provided for the write-only data lines electrically isolate the write-only data line pairs (W1, $\overline{W1}$ ... Wn, $\overline{Wn}$) from the constant voltage sources Vss.

Moreover, in the write operation, the switching elements 39a of the switching circuits 39 provided for the read-only data line pairs electrically connect the read-only data line pairs (R1, $\overline{R1}$ ... Rn, $\overline{Rn}$) to the respective constant voltage sources Vss.

Therefore, all of n pieces of data inputs to the input/output pads 13 (13-1 ... 13-n) are transferred to the data line pairs (W1, $\overline{W1}$ ... Wn, $\overline{Wn}$) as the write data lines corresponding to the input/output pads 13 (13-1 ... 13-n).

In the write operation, data is sent through the data line pairs (W1, $\overline{W1}$ ... Wn, $\overline{Wn}$) and the transistors 26 that are turned on by a selection signal from the Y decoder, and as has been well known, data goes through the corresponding differential amplifiers 18 (18-1 ... 18-n) and is written in the corresponding n pieces of memory cells 15.

Further, in the write operation, as mentioned above, being arranged between the write-only data line pairs and held at a constant ground potential Vss, the read-only data line pairs function as the shielding lines for the write-only data line pairs placed between the read-only data line pairs.

Therefore, while data is transferred through the write-only data line pairs to the memory cell array 12, by the shielding lines made up of the read-only data line pairs located between the adjacent write-only data line pairs, the instability of data in the write-only data line pairs is prevented, which is attributable to the common coupling capacity that occurs between the data line pairs.

As has been described, according to the semiconductor memory device 10 of the present invention, in writing data, the read-only data lines serve as the shielding lines and in reading data, the write-only data lines serve as the shielding lines. Consequently, the special shielding lines for the data bus 14 are not required whether data is written or read, so that stable data transfer by the data bus 14 can be executed both in writing and reading of data.

In the foregoing, as the example of the constant potential of the data lines functioning as the shielding lines, a ground potential of Vss is shown, but alternatively, it is possible to adopt a desired constant voltage source, such as s circuit power supply voltage Vcc or Vdd.

Further, in the foregoing, a case has been shown in which the write-only data lines are used as the shielding lines in a read operation and the read-only data lines are used as the shielding lines in a write operation. However, according to necessity, whether in a read operation or in a write operation, either the write-only data lines only or the read-only data lines only may be used as the shielding lines.

Description has been made of a case where the semiconductor memory device is a dynamic random access memory (DRAM) in which the memory cell has a cell capacitor. However, the present invention is not limited to this case, but may be applied to various memory devices, such as a static random access memory (SRAM) or a ROM.

According to the present invention, the data bus extending from the memory cells to the input/output pads is composed of the write-only data lines and the read-only data lines, and at least the parallel portions of both special-purpose data lines are arranged alternately in the direction in which they are arranged. In addition, either the read-only data lines or the write-only data lines function as the shielding lines for the other data lines. For these reasons, it is not necessary to provide the special-purpose shielding lines dedicated to shielding and data is made stable on the data bus.

What is claimed is:

1. A semiconductor memory device comprising:
   a memory cell array having a plurality of memory cells on a semiconductor substrate, wherein said memory cell array includes a differential amplifier circuit serving as data input/output terminals of said memory cell array when data is written in or read from a selected memory cell;
   a plurality of input/output pads, provided on said semiconductor substrate, for writing data to said memory cells and reading data from said memory cells; and
   a data bus that connects said differential amplifier and said input/output pads, wherein said data bus includes a plurality of write data lines dedicated for writing data to said memory cells and a plurality of read data lines dedicated for reading data from said memory cells, wherein said plurality of write data lines have mutually parallel portions and said plurality of read data lines have mutually parallel portions, wherein at least said parallel portions of said write data lines are arranged alternately with said read data lines in an arrangement direction of said parallel portions on said semiconductor substrate, and wherein said write data lines are held at a predetermined potential level when data is read and said read data lines are held at the predetermined potential level when writing data, to respectively function as shielded lines.

2. A semiconductor memory device according to claim 1, wherein said write data lines and said read data lines each consist of a pair of mutually complementary data lines, and pairs of data lines of said write data lines alternate with pairs of data lines of said read data lines.

3. A semiconductor memory device according to claim 2, wherein said memory cell array comprises a pair of bit lines mutually complementary to said memory cells and, wherein data line pairs of said write data lines are selectively connectable to said pair of bit lines and to a constant potential source of said memory cell array, the data line pairs of said write data lines being connected to said constant potential source when reading data.

4. A semiconductor memory device according to claim 2, wherein said memory cell array comprises a pair of bit lines mutually complementary to said memory cells and, wherein data line pairs of said read data lines are selectively connectable to said pair of bit lines and to a constant potential source of said memory cell array, the data line pairs of said read data lines being connected to said constant potential source when writing data.

5. A semiconductor memory device according to claim 1, wherein said data bus has at least one amplifier circuit inserted therein, said amplifier circuit includes a plurality of write amplifiers for said write data lines and read amplifiers for said read data lines, and wherein said write amplifiers and said read amplifiers are arranged alternately in a line in an extending direction of said data bus and on one side of said data bus.

6. A semiconductor memory device according to claim 5, wherein said write amplifiers and said read amplifiers have input and output terminals provided on a side facing said data bus, said input and output terminals being connected to corresponding data line pairs of said write data lines and said read data lines.

7. A semiconductor memory device according to claim 1, wherein said semiconductor memory device is a dynamic RAM having volatile memory cells.

8. A semiconductor memory device according to claim 1, wherein said memory cell arrays are formed as a plurality of banks, and wherein said data bus is connected through data bus branch portions thereof to said banks.

9. A semiconductor memory device comprising:
a memory cell array which has a plurality of memory cells and a differential amplifier circuit, the differential amplifier circuit amplifying read data from a memory cell and write data to be written into the memory cell;
a plurality of input/output pads which receive the write data and the read data; and
a data bus, coupled between the differential amplifier circuit and said input/output pads, which includes a plurality of write data lines transferring the write data and a plurality of read data lines transferring the read data,
wherein said write data lines and said read data lines have mutually parallel portions, wherein at least the parallel portions of said write data lines are arranged alternately with said read data lines in an arrangement direction of said parallel portions, wherein said write data lines are held at a predetermined potential level when said read data lines transfer the read data, and wherein said read data lines are held at the predetermined potential level when said write data lines transfer the write data.

10. A semiconductor memory device according to claim 9, wherein said write data lines and said read data lines each consist of a pair of mutually complementary data lines, and pairs of data lines of said write data lines alternate with pairs of data lines of said read data lines.

11. A semiconductor memory device according to claim 9, further comprising:
a first switching circuit, connected to said read data lines, which applies the predetermined potential level to the read data lines when the write data lines transfer the write data; and
a second switching circuit, connected to the write data lines, which applies the predetermined potential level to the write data lines when the read data lines transfer the read data.

12. A method of shielding a data bus of a semiconductor memory device, the semiconductor memory device including a memory cell array having a plurality of memory cells and differential amplifiers coupled to the memory cells,
the data bus including pairs of read data lines and pairs of write data lines having portions thereof mutually parallel with respect to each other and being coupled between the differential amplifiers and input/output terminals of the semiconductor memory device, the method comprising:
holding the pairs of read data lines to a predetermined potential level during writing of data into the memory cell array; and
holding the pairs of write data lines to the predetermined potential level during reading of data from the memory cell array.

13. The method of shielding a data bus of claim 12, wherein the pairs of read data lines and the pairs of write data lines are alternately arranged with respect to each other.

14. The method of shielding a data bus of claim 12, wherein the semiconductor memory device is a dynamic RAM and the memory cells are volatile memory cells.

* * * * *